United States Patent
Low et al.

(10) Patent No.: US 8,497,158 B2
(45) Date of Patent: Jul. 30, 2013

(54) LEADFRAME STRIP AND MOLD APPARATUS FOR AN ELECTRONIC COMPONENT AND METHOD OF ENCAPSULATING AN ELECTRONIC COMPONENT

(75) Inventors: Jeffrey Khai Huat Low, Melaka (MY); Kean Cheong Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/612,922

(22) Filed: Sep. 13, 2012

(65) Prior Publication Data
US 2013/0011973 A1    Jan. 10, 2013

Related U.S. Application Data

(62) Division of application No. 11/994,505, filed as application No. PCT/IB2005/002084 on Jul. 20, 2005, now Pat. No. 8,334,583.

(51) Int. Cl.
*H01L 21/56* (2006.01)

(52) U.S. Cl.
USPC ............ 438/112; 438/123; 438/124; 438/127

(58) Field of Classification Search
USPC ........................................................ 438/112
See application file for complete search history.

(56) References Cited

U.S. PATENT DOCUMENTS

| | | | |
|---|---|---|---|
| 3,374,536 A * | 3/1968 | Schroeder et al. | 29/613 |
| 3,606,673 A * | 9/1971 | Overman | 29/827 |
| 3,716,764 A * | 2/1973 | Birchler | 257/666 |
| 4,346,396 A | 8/1982 | Carroll et al. | |
| 4,451,973 A * | 6/1984 | Tateno et al. | 29/827 |
| 4,546,374 A * | 10/1985 | Olsen et al. | 257/772 |
| 4,649,637 A * | 3/1987 | Hatakeyama | 29/827 |
| 4,888,307 A * | 12/1989 | Spairisano et al. | 264/272.17 |
| 5,197,183 A | 3/1993 | Chia et al. | |
| 5,344,600 A * | 9/1994 | McShane et al. | 264/219 |
| 5,434,449 A | 7/1995 | Himeno et al. | |
| 5,514,913 A * | 5/1996 | Mangiagli et al. | 257/787 |
| 5,557,842 A | 9/1996 | Bailey | |
| 5,563,441 A | 10/1996 | Kato | |

(Continued)

FOREIGN PATENT DOCUMENTS

| | | |
|---|---|---|
| DE | 10142472 | 10/2002 |
| JP | 03132063 | 6/1991 |
| JP | 10070223 | 3/1998 |

OTHER PUBLICATIONS

Non-Final Office Action mailed Jan. 19, 2012 in U.S. Appl. No. 11/994,505.

*Primary Examiner* — David Vu
*Assistant Examiner* — Earl Taylor
(74) *Attorney, Agent, or Firm* — Dicke, Billig & Czaja, PLLC

(57) ABSTRACT

A leadframe strip comprises a plurality of units arranged in a line. Each unit provides two component positions, each having a chip support substrate. The chip support substrates of the two component positions are mechanically linked by at least one support bar. The two component positions of a unit are molded at essentially the same time to produce a plastic housing for a package in each component position. The central portion of the first support bars remains outside of the plastic housing of the two packages.

8 Claims, 4 Drawing Sheets

U.S. PATENT DOCUMENTS

| | | | |
|---|---|---|---|
| 5,821,610 A | 10/1998 | Nishikawa | |
| 5,973,388 A | 10/1999 | Chew et al. | |
| 5,977,630 A | 11/1999 | Woodworth et al. | |
| 6,114,750 A * | 9/2000 | Udagawa et al. | 257/666 |
| 6,255,722 B1 | 7/2001 | Ewer et al. | |
| 6,306,331 B1 * | 10/2001 | Lajza et al. | 264/272.13 |
| 6,307,272 B1 * | 10/2001 | Takahashi et al. | 257/787 |
| 6,335,548 B1 | 1/2002 | Roberts et al. | |
| 6,403,009 B1 * | 6/2002 | Saxelby et al. | 264/272.15 |
| 6,476,481 B2 | 11/2002 | Woodworth et al. | |
| 6,479,327 B2 * | 11/2002 | Takahashi et al. | 438/124 |
| 6,650,004 B1 | 11/2003 | Horie et al. | |
| 6,667,547 B2 * | 12/2003 | Woodworth et al. | 257/696 |
| 6,703,695 B2 * | 3/2004 | Nakazawa | 257/676 |
| 6,756,658 B1 | 6/2004 | Gillett et al. | |
| 6,800,932 B2 | 10/2004 | Lam et al. | |
| 6,841,414 B1 | 1/2005 | Hu et al. | |
| 6,919,644 B2 | 7/2005 | Uchida | |
| 6,936,915 B2 | 8/2005 | Fujita | |
| 7,005,326 B1 | 2/2006 | Glenn | |
| 7,030,474 B1 | 4/2006 | Glenn | |
| 7,084,491 B2 * | 8/2006 | Satou et al. | 257/676 |
| 7,138,673 B2 | 11/2006 | Tanaka | |
| 7,196,313 B2 | 3/2007 | Quinones et al. | |
| 7,208,818 B2 | 4/2007 | Luo et al. | |
| 7,582,958 B2 | 9/2009 | Brailey | |
| 7,615,852 B2 | 11/2009 | Otremba | |
| 2001/0033008 A1 | 10/2001 | Kaneda et al. | |
| 2001/0041386 A1 * | 11/2001 | Yasunaga | 438/112 |
| 2001/0045627 A1 | 11/2001 | Connah et al. | |
| 2002/0093094 A1 * | 7/2002 | Takagawa et al. | 257/723 |
| 2004/0145043 A1 | 7/2004 | Hayashi et al. | |
| 2004/0262720 A1 | 12/2004 | Satou et al. | |
| 2006/0151868 A1 | 7/2006 | Zhu et al. | |
| 2006/0261498 A1 * | 11/2006 | James | 257/787 |
| 2008/0290484 A1 * | 11/2008 | Low et al. | 257/675 |
| 2013/0011973 A1 * | 1/2013 | Low et al. | 438/123 |

* cited by examiner

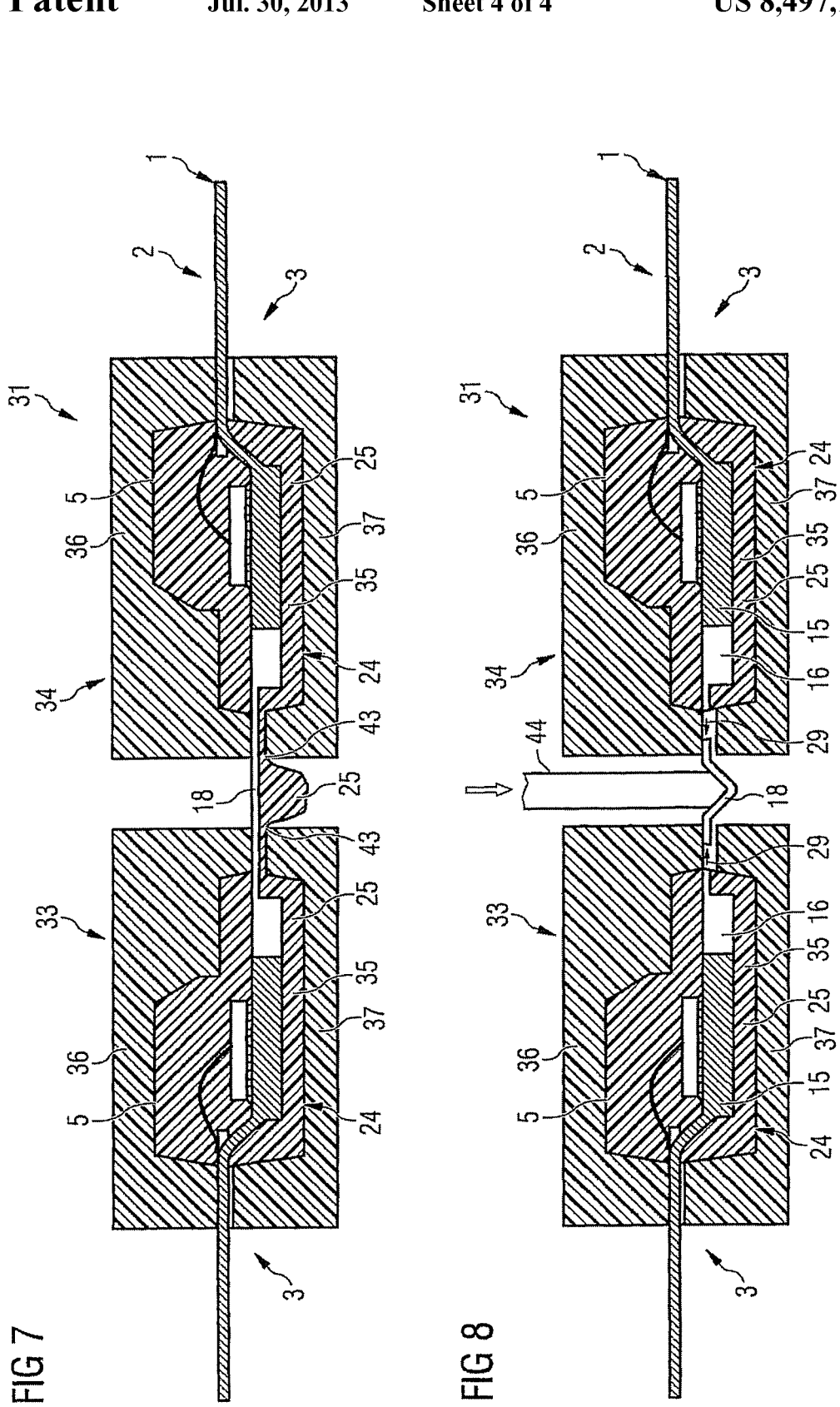

LEADFRAME STRIP AND MOLD APPARATUS FOR AN ELECTRONIC COMPONENT AND METHOD OF ENCAPSULATING AN ELECTRONIC COMPONENT

CROSS-REFERENCE TO RELATED APPLICATIONS

This Utility patent application is a divisional application of U.S. application Ser. No. 11/994,505, filed Jun. 5, 2008, which is a U.S. National Stage filing under 35 U.S.C. 371 of International Application PCT/IB2005/002084, filed Jul. 20, 2005, which are both incorporated herein by reference.

BACKGROUND

In TO220-type packages in which the rear side of the die pad is embedded in the molding compound, it is important to accurately control the thickness of the mold compound above the rear side of the die pad. This layer of mold compound provides the electrical isolation layer for the die pad. If the thickness of the mold compound varies from the desired thickness, the product fails the electrical tests and has to be discarded.

This problem has been addressed by holding the die pad within the cavity of the transfer molding system by pins arranged above and below the die pad, as is described in U.S. Pat. No. 5,514,913, for example. As the mold compound enters the cavity, the pins are slowly retracted as the mold compound begins to cure and harden. The pins are retracted fully from the cavity as the mold compound begins to fully solidify.

This method suffers from the problem that the pins experience severe wear. As the mold compound begins to cure, its viscosity increases due to the cross-linking of the resin and silica. This creates a high friction between the mold compound and the pins which is likely to cause damage to the pins.

A further problem is that the pins are unreliable as mold compound can seep into the sleeves of the pins. The pins are then unable to extend the intended distance into the package and are also unable to be fully retracted out of the package. This results in the failure of the product as the minimum thickness of the isolation layer is not provided. Furthermore, unsightly pin marks are produced on the outside of the package.

A further disadvantage is that the process window timing and sequence of the retractable pins have to be carefully controlled to achieve a successful outcome. These parameters are difficult to optimise and accurately control. The pins also create flow turbulence when be the mould compound is injected into the cavity. This can also result in an inconsistency of the thickness of the isolation layer as well as flow marks and voids.

Due to the complexity of the process window timing and pin sequence, this process is used to mold one component position of a leadframe strip in one process step. The process is, therefore, also relatively slow and expensive.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Embodiments of the invention will now be described with reference to the diagrams.

FIGS. 5 to 8 illustrate steps in the transfer molding method according to the invention.

FIG. 5 illustrates the positioning of the leadframe strip in the mold apparatus of the invention.

FIG. 6 illustrates the injection of the mold material into the mold apparatus of FIG. 5.

FIG. 7 illustrates the mould apparatus of FIG. 6 after the cavities have been filled with mold material.

FIG. 8 depicts the removal of the support bar between the two cavities of the mold apparatus of FIG. 7.

DETAILED DESCRIPTION

Figure 1:
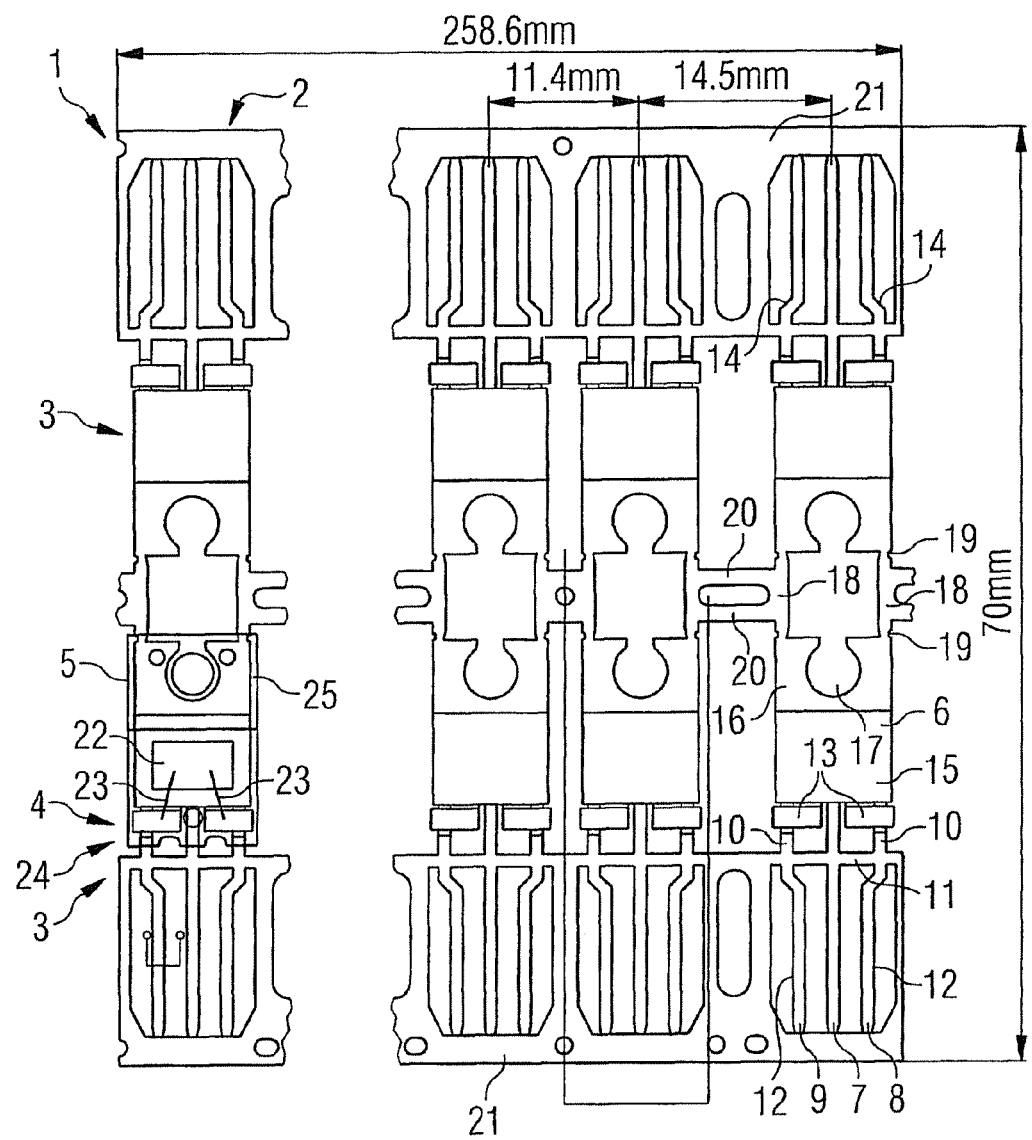
FIG. 1 illustrates a plan view of the leadframe strip according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the invention provide a leadframe strip which includes a plurality of units arranged in a line. Each of the plurality of units provides two component positions.

Each component position includes a chip support substrate, a drain lead extending from the chip support substrate in a direction, at least one source lead and at least one gate lead. Both the source lead and the gate lead extend in a direction parallel to the drain lead. Each lead has an inner portion and an outer portion. The end of the inner lead portion of the source lead and of the gate lead is spaced from the chip support substrate. The source lead, the gate lead and the drain lead are located on one side of the chip support substrate and are coupled by a tie bar. To avoid repetition, "leads" is occasionally used in the application to denote the source lead, the gate lead and the drain lead collectively.

Each component position is suitable for use as the substrate in an electronic component such as a semiconductor package and each component position of a unit and of the leadframe strip is essentially the same.

The chip support substrates of the two component positions of each unit are disposed adjacent to each other and at least one first support bar extends between the chip support substrates of the two component positions of each unit. The first support bar extends in a direction which is parallel to the drain lead.

The two chip support substrates of each unit are, therefore, disposed at a distance from one another but are mechanically connected by the at least one first support bar. The leadframe strip, therefore, provides a plurality of component positions in which the chip support substrate is more effectively supported within the strip, as the two component positions of each unit are arranged symmetrically about a line perpendicular to the first support bar.

The leadframe strip according to the invention has the advantage that the component positions can be transfer molded without the use of retractable pins as the chip support substrates can be adequately supported by the first support bars which mechanically connect the two component positions.

The leadframe strip according to the invention also has the advantage that each unit provides two component positions. If the subsequent mounting and, in particular, the molding processes are carried out on each unit sequentially, the manufacturing throughput can be increased. Consequently, production costs and ultimately the cost of the package can be reduced.

The leadframe strip may also include further tie bars or support bars along the peripheral edge of the strip which mechanically link the units of the leadframe strip. These tie bars typically include through-holes which enable the strip to be automatically handled and fed through the various machines used in the production process. The size and positioning of these through holes corresponds to the known standards so that the lead frame strip of the invention can be used in existing machinery.

In an embodiment of the invention, the source lead, the gate lead, the drain lead and the first support bar extend in a direction substantially perpendicular to the line of the lead frame strip. Therefore, the plurality of units are arranged across the width of the lead frame strip. The source lead, the gate lead and the drain lead of each component position extend towards the outer edge of the lead frame strip and the chip support substrates of each component position is located towards the center of the lead frame strip.

The source lead, the gate lead and the drain lead of each component position are coupled with one another by an outer tie bar portion. The outer tie bar portion extends in the direction of the line of the lead frame strip, and extends, therefore, in a direction essentially perpendicular to the leads. The outer tie bar portion is positioned at the boundary of the inner and outer lead portion of each of the leads. This arrangement provides further mechanical support for the leads of each component position. Since the leads are mechanically connected by the outer tie bar portion, they are more unlikely to be mechanically damaged during the assembly process.

In an embodiment of the invention, two first support bars are provided, each of which extends from the chip support substrate. The support bars are spaced apart from each other and are disposed at the opposing edges of one side of the chip support substrate. The two support bars, therefore, mechanically link the peripheral edges of the two chip support substrates within each unit. This arrangement has the advantage that a more uniform support is given to the two chip support substrates of each unit and, additionally, and unoccupied area is provided in the lateral center of each unit. This unoccupied area further simplifies the method of molding which will be more fully described later.

Second support bars are provided which couple and mechanically link adjacent chip support substrates of adjacent units within the leadframe strip. This, again, provides further mechanical support to the chip support substrates. This further increases the reliability during the component assembly and molding processes as the chip support substrates are more unlikely to be deformed.

The second support bars, in an embodiment, extend between the first support bars of adjacent chip support substrates of adjacent units in the lead frame strip. This arrangement simplifies the cutting and trimming process during which the various support bars and tie bars of the lead frame strip removed to provide a plurality of electronic components. The second support bars extend in a direction essentially perpendicular to the first support bars and, therefore, extend in a direction parallel to the line of the leadframe strip. This provides a uniform support between adjacent units of the lead frame strip.

The chip support substrate may include a chip mounting region and a heat sink region. The chip mounting region is disposed adjacent the source lead and the gate lead. The drain lead extends from the chip mounting region. The chip mounting region has lateral dimensions adapted to accommodate the semiconductor chip or chips of the electronic component. This simplifies the bonding process and provides short bonding lengths between the semiconductor chip, when it is mounted in the chip mounting region, and the leads of the component position. The heat sink region remains uncovered by the semiconductor chip and, therefore, is positioned laterally adjacent the semiconductor chip. The first support bar, therefore, extends between the heat sink regions of the two chip support substrates of each unit.

In an embodiment of the invention, the heat sink region further includes an aperture. The aperture is laterally positioned so that, after the molding process, it is laterally aligned with an aperture in the molded housing of the electronic component. The molded electronic component, therefore, includes a through-hole.

The electronic component may be mounted to a substrate, such as a printed circuit board, by a fixing means such as a screw which is positioned in the aperture and clamps the electronic component to the printed circuit board. This provides a simple method of mounting the component. Furthermore, the heat dissipation from the package is improved, particularly if the heat sink region is mounted on a flange or further heat sink located in the printed circuit board.

The first support bar includes at least one predetermined breaking point. This enables the support bar to be more reliably removed during the cutting and trimming process since the breaking point can be more accurately controlled. Also, less mechanical force is required to sever the first support bar so that the risk of damage to the chip support substrate and the package is reduced.

The predetermined breaking point can be easily provided in the form of a narrowing in the cross-section of a first support bar. This can be simply done by a narrowing in the width of the first support bar which can be provided when the component positions are formed in the lead frame strip.

The chip mounting region as a thickness greater than the thickness of the heat sink region, the gate lead, the source lead and the drain lead. This provides a more mechanically stable area onto which the semiconductor chip is mounted. Therefore, deformation of the chip support substrate during the die attach process is reduced.

The heat sink region of the chip support substrate is essentially the same thickness as the leads. This simplifies the manufacturing process of the leadframe strip. In one embodiment, the chip mounting region is approximately 2.5 times the thickness of the source lead the drain lead and the gate lead.

In an embodiment of the invention, each component position provides a leadframe which is suitable for an electronic component with a TO220 package outline. The dimensions and other characteristics of the TO220 package outline are defined by known agreed industry standards.

In an alternative embodiment of the leadframe strip, the plurality of units are arranged in the leadframe strip so that the leads and the first support bar extend in a direction parallel to the line. In this embodiment, the outer portions of the leads of one unit are disposed adjacent to the outer portions of the leads of the adjacent unit in the strip.

The leadframe strip includes copper or a copper alloy, or a nickel-iron alloy such as Alloy 42. The inner bonding areas and the chip mounting region may further include a layer of a suitable bondable material.

The invention also relates to methods for encapsulating electronic components and to methods of assembling electronic components using the leadframe strip according to one of the embodiments already described.

Firstly, a leadframe strip according to one of the embodiments previously described is provided. The leadframe strip can be produced using known stamping and etching methods. The leadframe strip including a plurality of units, each unit providing two component positions according to one of the embodiments previously described. A plurality of semiconductor chips are provided, each semiconductor chip including a source electrode, a gate electrode and a drain electrode.

The plurality of semiconductor chips are then mounted on the chip support substrates of the component positions of the plurality of units. One or more than one semiconductor chip may be mounted on each chip support substrate.

The gate electrode of the semiconductor chip is then electrically connected to the bonding area of the inner bonding area of the gate lead by one or more bond wires. The source electrode is electrically connected to the bonding area of the inner bonding area of the source lead by a one or more bond wires.

In an embodiment, the source and gate electrodes are located on the upper surface of the semiconductor chip and the drain electrode is located on the opposing rear surface of the semiconductor chip. The drain electrode is electrically connected with the drain lead by the die attach material used to mount the chip on the chip support substrate.

A transfer molding process is then carried out to encapsulate the semiconductor chip, the bond wires and the inner bonding areas of the source lead and of the gate lead of the two component positions of each unit. The semiconductor chip, the bond wires and the inner lead portions of the drain lead, of the source lead and of the gate lead are encapsulated in plastic material which forms a component housing.

The transfer molding process is carried out such that a component housing is formed in each component position and such that each of the two component positions of a unit is encapsulated at essentially the same time and such that the central portion of the first support bar remains outside of the component housings.

Therefore, in a method according to the invention, the molding process is carried out for two component positions in a single process step. The time required to mold a certain number of component positions is, therefore, reduced by essentially 50% and the throughput of the production line is essentially doubled.

The leadframe strip according to the invention also provides an improved mechanical support for the chip support substrates of the two component positions of each unit. Since the two chip support substrates are mechanically linked by the support bar, bending or warping of the chip support substrate during the encapsulation process is reduced.

The first support bar positioned between the chip support substrates of each unit enables the molding process to be carried out without the use of pins or retractable pins to maintain the position of the chip support substrate in the mold. Therefore, the problems associated with the unreliability of the pins are avoided and the manufacturing output is further increased.

After the transfer molding process for the unit is carried out, two component housings are mechanically linked by the first support bar. The central portion of the first support bar and the other support bars and tie bars of the lead frame strip are later removed.

The component housing, fabricated using a method of the invention, can be distinguished by the absence of pin marks on the upper and lower surfaces of the housing and by the presence of an indent or hole in the side face of the component housing in which the first support bar was positioned.

In an embodiment, the transfer molding process is carried out using a mold including an upper part and a lower part. The upper part of the mold is positioned above the upper side of the lead frame strip and the lower part of the mold is positioned above the lower side of the lead frame strip. The upper side of the lead frame strip is denoted as the side on which the semiconductor chip is mounted.

The tie bars and the first support bars of each of the two component positions of the unit are clamped between the upper part and lower part of the mold such that two cavities are formed by the upper part and the lower part of the mold. Each cavity has essentially the same dimensions and has the dimensions of the desired component housing or package outline.

The central portion of the first support bar, therefore, remains outside of the two cavities. The tie bars and the first support bars of each of the two component positions of the unit are clamped between the upper part and lower part of the mold that the chip support substrate of the two component positions of the unit floats in each of the cavities. The rear surface of the chip support substrate is spaced apart from a bottom surface defining the cavity by a distance.

As the first support bar is clamped between the upper part and the lower part of the mold, the chip support substrate is reliably held floating in the cavity so that, during the filling of the cavity by the plastic encapsulation material, the chip support substrate is prevented from undesirably warping or bending. Therefore, the thickness of the plastic encapsulation material above the rear side of the chip support substrate, this material providing the isolation layer, is uniform. This provides a reliable manufacturing method as the reject rate, caused by nonuniformities in the isolation layer, is reduced.

Since each unit of the leadframe strip is symmetrical about a line perpendicular to the first support bar, a uniform mechanical stress is applied to the leadframe strip when the leadframe strip is clamped between the two parts of the mold. This provides improved mechanical support for the chip support substrates and maintains the position of the chip support substrates within the cavities. Therefore, a uniform isolation is provided while avoiding the use of pins or retractable pins or further mechanical support means for the chip support substrate.

The plastic material which will form the component housing is injected into each of the two cavities of the mold at essentially the same time. This can be carried out by using a single source of plastic material and an injection system with two nozzles, one for each cavity. Alternatively, two separate sources of plastic material each with an injection nozzle can be used.

After the transfer molding process is completed, and the plastic material is cured or cross linked, the mold can be removed to produce two component housing mechanically linked by the first support bar and mechanically a part of the leadframe strip.

The first support bar may be cut or removed by a bending stress. This is easily provided by moving, for example, a tool downwardly between the two component housings. Since the two component positions are molded at essentially the same time in two separate cavities, the first support bar can remain uncontaminated by the plastic mold material. This reduces wear on the cutting tool and further improves the reliability of the trimming process. Alternatively, the support and tie bars may be removed while the mold is still in position on the leadframe strip.

The rear surface of the chip support substrate is spaced apart from the bottom surface defining the cavity by a distance in the range from approximately 0.3 mm to approximately 0.5 mm. This distance provides an isolation layer with a thickness which provides the required electrical isolation characteristics for the package.

The upper part and the lower part of the mold, when placed either side of the lead frame strip and when clamping the first support bar and tie bar hold the chip support substrates of the two component positions of the unit in tension. This further prevents the bending or warping of the chip support substrates during the encapsulation process.

Each cavity provided by the mold, when the upper part and lower part are clamped together has the dimensions of the component housing of a TO220 package outline.

The invention also relates to mold apparatus and, in particular, to mold apparatus suitable for use with the leadframe strip previously described and/or suitable for use in the method previously described.

The mold apparatus includes an upper part having a wall thickness with an interfacial surface and a lower part having a wall thickness with an interfacial surface. The upper part and the lower part of the mold, when placed together, provide two cavities of essentially the same dimensions. The interfacial surface of the upper part and the interfacial surface of the lower part are therefore, at least partly in contact.

The two cavities are spaced apart from one another, are located laterally adjacent to one another and lie in essentially the same plane. Each cavity has an outer side wall and an opposing inner side wall, the inner side walls of the two cavities are positioned adjacent one another.

When the upper part and the lower part of the mold are placed together, each outer side wall further includes three first channels which extend through the thickness of the outer side wall. The three first channels extend in essentially parallel directions. The dimensions of each first channel are adapted to accommodate a drain lead, a source lead or a gate lead.

Additionally, when the upper part and the lower part of the mold are placed together, each inner side wall includes at least one second channel which extends through the thickness of the inner side wall in a direction essentially parallel to the three first channels in the outer side wall. The dimensions of the second channel are adapted to accommodate a first support bar. The second channels positioned in each of the inner side walls are laterally aligned with one another.

At least one through-hole is provided in the mold which is suitable for the injection of mold compound into the cavities.

The mold apparatus according to the invention, therefore, provides two cavities of essentially the same dimensions. Therefore, two components can be molded in the same process step and the manufacturing throughput essentially doubled.

The mold apparatus of the invention is also distinguished by the absence of pins, retractable pins or other means of supporting the chip support substrates within the cavities.

The second channels positioned in the inner side wall of each of the two cavities are adapted to accommodate the same first support bar. The first support bar is then more effectively clamped between the upper and lower part of the mold. This provides further mechanical support to the chip support substrates and prevents their deformation during the molding process.

The inner side wall of each of the two cavities may also, in an alternative embodiment, include two second channels. Each second channel is adapted to accommodate a first support bar.

The three first channels may be provided by grooves positioned in the interfacial surface of the wall thickness of the lower part or of the upper part of the mold. The interfacial surface is that surface of the mold part which, when the two parts are clamped together to form the cavity, is in contact with the second part of the mold. Alternatively, each of the three first channels may be provided by a pair of laterally aligned grooves positioned in the interfacial surfaces of the wall thickness of both the lower part and the upper part of the mold.

Similarly the second channel in the inner side wall provided by grooves positioned in the interfacial surface of the wall thickness of the lower part or of the upper part of the mold. Alternatively, the second channel may be provided by a pair of laterally aligned grooves positioned in the interfacial surfaces of the wall thickness of the lower part and of the upper part of the mold.

A through-hole suitable for the injection of mold compound into the cavity is located in the inner side wall of each cavity and the two through holes are positioned laterally opposite to each other, typically when a single source of encapsulation material with two injection nozzles is used. If two sources of encapsulation material, each with an injection nozzle is used the two through holes may be offset with respect to each other as this creates more space for the two nozzles.

The upper part of the mold may be provided by two or more pieces. Similarly, the lower part of the mold may be provided by two or more pieces. The use of two pieces provides free space in which the injection nozzle can be placed. In this way, mold free space is available for the positioning of the injection nozzle.

In one embodiment of the invention the dimensions of each cavity provided by the mold apparatus are adapted to provide the component housing of TO220 package.

In summary, the leadframe, the method and the mold apparatus according to the invention have the advantage that the chip support substrate or die pad is held in floating or in isolation in the mould cavities without the use of retractable pins. The first support bar holds the two adjacent die pads of the unit together so that, during the molding process, the die pad is rigidly held. Therefore, a consistent and uniform layer of mold compound on the rear side of the die pad is provided which creates a uniform isolation layer. Since the isolation layer thickness is consistent, the package performance can be improved and, in particular, the failure rate of the production process is reduced.

The thickness of the isolation layer can also be altered to cater for various electrical characteristic variants of the packages. The thickness can be easily controlled by changing the mold cavity down set.

The avoidance of retractable pins in the mold process leads to the advantage that the maintenance costs and the maintenance effort required to replace worn or damaged pins can be reduced. Additionally, the molding process yield is improved as, due to the lack of pins, the flow of the mould compound into the cavity is more consistent since turbulence is not created by the presence of the pins. Therefore, fewer voids in the package material and fewer cosmetically undesirable visual flow marks are produced.

A further advantage is that the manufacturing cost of the packages can be reduced as the leadframe strip has a matrix form in which each unit provides a leadframe for two packages. Since two component positions are molded in a single process step to produce two components or packages, the throughput in the molding and in the singulation processes of the manufacturing line is increased.

FIG. 1 illustrates a leadframe strip 1 according to an embodiment of the invention. The leadframe strip 1 includes a plurality of units 2, each unit 2 including two component positions 3. Each component position 3 of the leadframe strip 1 is essentially the same. Therefore, each unit 2 of the leadframe strip 1 is essentially the same. The leadframe strip includes copper.

The plurality of units 2 are arranged in the leadframe strip 1 parallel to each other and are arranged across the width of the leadframe strip 1. Therefore, each unit 2 lies essentially perpendicular to the long axis of the lead frame strip 1, which is illustrated horizontally in the view of the leadframe strip 1 of FIG. 1.

Each component position provides the lead frame 4 for a T0220 type package. The position of the package outline 5 is indicated for the component position 3 and the bottom left-hand corner of the leadframe strip 1.

Each component position 3 includes a chip support substrate or die pad 6 and three leads which are arranged on one side of the chip support substrate 6. The chip support substrate 6 of each component position 3 is positioned towards the center of the leadframe strip 1 and the leads extend towards the peripheral edge of the leadframe strip. Each unit 2 is, therefore, symmetrical about the long axis of the leadframe strip 1.

The chip support substrate 6 is essentially rectangular. Its long side is arranged perpendicular to the long axis of the leadframe strip 1 and its short side is positioned essentially parallel to the long axis of the leadframe strip 1.

The three leads of each components position 3 extend in directions parallel to each other and perpendicular to the long axis of the leadframe strip 1. The drain lead 7 extends from, and is mechanically connected to, the chip support substrate 6 and is positioned in approximately the center of the short edge of the chip support substrate 6. The source lead 8 and the gate lead 9 are positioned one on each side of the drain lead 7 and are positioned at the peripheral edge of the short side of the chip support substrate 6.

Each lead 7, 8 and 9 has an inner portion 10 and an outer portion 12. The inner portion 10 of the source lead 8 and of the gate lead 9 is spaced from the edge of the chip support substrate 6. The source lead 8 and the gate lead 9 are not in physical contact with the chip support substrate 6. The three leads of each component position 3 are mechanically coupled to each other by a portion of the outer tie bar 11. The outer tie bar 11 extends in a direction parallel to the long axis of the lead frame strip and is positioned between the inner portion 10 and outer portion 12 of each of the leads 7, 8 and 9.

The outer portion 12 of the source lead 8 and the gate lead 9 has a reduced width towards the periphery. The drain lead 7 has essentially the same width in its outer portion 12. The width of the drain lead 7 is, however, slightly increased in its inner portion 10 compared to the width of the outer portion 12. The outermost portion of each of the leads 7, 8 and 9 has essentially the same width.

In this embodiment of the invention, a bonding area 13 is located at the end of the inner portion 10 of the source lead 8 and of the gate lead 9. The bonding areas 13 are positioned adjacent the chip support substrate 6 and extends inwardly towards the drain lead 7. Each bonding area 13 is, therefore, rectangular and is positioned with its long side parallel to the long axis of the leadframe strip 1. This arrangement creates a larger bonding area so that, particularly for the source lead 8, several bond wires can be accommodated. The outer portion 12 of the source lead 8 and gate lead 9 includes a bend 14 adjacent to the outer tie bar 11 which extends inwards towards the drain lead 7. The outer edge of the inner portion 10 of the source lead 8 and the gate lead 9 is positioned in approximate alignment with the opposing long edges of the chip support substrate 6.

The chip support substrate 6 includes a chip mounting region 15 and a heat sink region 16. The chip mounting region 15 is positioned adjacent the respective bonding areas 13 of the source lead 8 and gate lead 9. The drain lead 7, therefore, extends from the chip mounting area 15. The chip mounting area 15 has a size adapted to accommodate the semiconductor chip or chips which are to be included in the package. The heat sink region 16 remains uncovered by the semiconductor chip. The heat sink region 16 further includes an aperture 17. The aperture 17 is laterally essentially circular and is located in approximately the center of the short side of the chip support substrate 6. The aperture 17 is positioned in the edge so that the edge of the chip support substrate 6 includes a cutout.

Each unit 2 includes two component positions 3 which are mechanically linked by two first support bars 18 which extend from the peripheral edge of the short side of the heat sink regions 16. The first support bars 18, therefore, extend in a direction parallel to the leads 7, 8 and 9 and parallel to the long side of the chip support substrate 6. The first support bars 18, therefore, lie essentially perpendicular to the long axis of the lead frame strip 1.

The first support bars 18 further include narrowing in the width to provide a predetermined breaking point 19 at the joint between each end of the support bar 18 and the chip support substrates 6 of the two component positions 3. This enables the first support bars 18 to be more reliably removed during the trimming process.

Each unit 2 is linked to an adjacent unit 2 in the leadframe strip 1 by two second support bars 20 which are positioned between the first support bars of adjacent units 2. The second support bars 20, therefore, extend in a direction essentially parallel to the long axis of the leadframe strip 1. Adjacent units 2 of the leadframe strip 1 are further mechanically linked by the outer tie bar 11 which extends not only between the leads 7, 8 and 9 of one component position 3 but also between the leads of the component positions 3 of the adjacent units. The leadframe strip 1 also includes peripheral support bars 21 which mechanically link the extreme outer end of the leads 7, 8 and 9 with the outer tie bar 11. The outer support bars 21 also include regularly spaced through holes which enable the leadframe strip 1 to be handled automatically in the production machinery.

The position of the semiconductor chip 22, bond wires 23 as well as the package outline 5 of a TO220 package 24 are illustrated for the component position 3 in the bottom left-hand corner of FIG. 1. The semiconductor chip 22 is mounted on the chip mounting area 15 of the chip support substrate 6 adjacent to the bonding areas 13 of the source lead 8 and gate lead 9. The semiconductor chip 22 includes a source electrode, a gate electrode and a drain electrode which are not illustrated in the diagram for clarity. However, the source electrode is electrically connected by a bond wire 23 to the bonding area 13 of the source lead 8. The gate electrode is electrically connected by a bond wire 23 to the bonding area 13 of the gate lead 9.

The drain electrode is positioned on the opposing surface of the semiconductor chip 22 and is electrically connected to the chip mounting area 15 and, consequently, the drain lead 7 by the die attach material which fixes the semiconductor chip 22 to the chip mounting area 15. The chip mounting region 15, heat sink region 16, the bonding areas 13 as well as the extreme inner portion of the inner portions 10 of the leads 7, 8 and 9 are positioned inside the plastic material 25 of the package 24.

In the description of the following figures, the same reference numbers are used to denote the same features.

Figure 2:
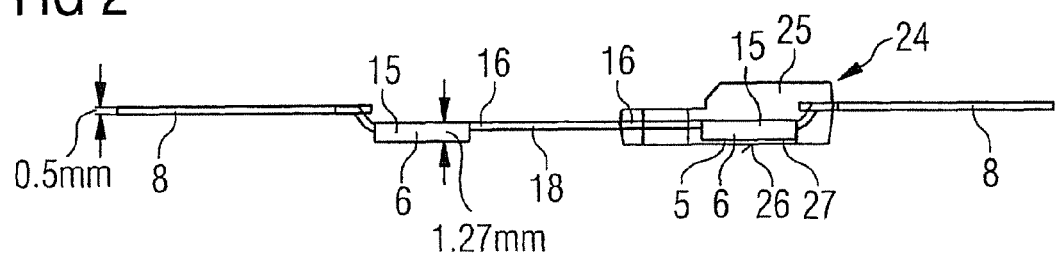
FIG. 2 illustrates a cross-sectional view of the leadframe strip of FIG. 1.

FIG. 2 illustrates a cross-sectional view of the width of the leadframe strip 1 of FIG. 1 in which the two component positions 3 of one unit 2 are depicted. In the cross-sectional view, it can be seen that the leads 7, 8, and 9 line in a plane above that of the chip support substrate 6. The drain lead 8, which is mechanically connected to the chip support substrate 6, therefore, includes an upward bend. From the cross-sectional view of FIG. 2, it is also illustrated that the chip mounting area 15 of the chip support area 6 has a greater thickness than the heat sink region 16 and the leads 7,8 and 9 of lead frame strip. The upper surface of the chip mounting region 15 and the heat sink region 16 of the chip support substrate lie in essentially the same plane. The lower surface 26 of the chip support substrate, therefore, includes a protrusion to provide the increased thickness in the chip mounting region. The chip mounting region 6 has a thickness of 1.27 millimeters whereas the leads 7, 8 and 9 have a thickness of 0.5 millimeters.

The position of the package outline 5 is illustrated for the right hand component position 3 in FIG. 2. The TO220 package outline 5 has a greater thickness in the region surrounding the chip mounting region 15 than in the region surrounding the heat sink region 16. The rear surface 26 of the chip mounting area 15 lies within the mold compound 25 of the package 24. The rear side 26 of the chip mounting region 15 is covered by a layer of mold compound with a thickness of between 0.3 and 0.5 millimeters. This layer forms the isolation layer 27.

Figure 3:
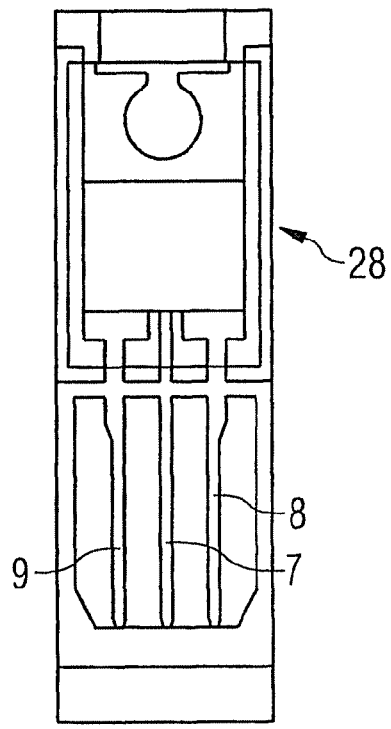
FIG. 3 illustrates an alternative lead configuration for the leadframe strip of FIGS. 1 and 2.

FIG. 3 illustrates an alternative embodiment for a component position 28 of the leadframe strip of FIG. 1. The component position 28 differs from the embodiment illustrated in FIG. 1, in that the source lead 8 and the gate lead 9 are essentially straight. The inner portion 10 of the source lead 8 and the gate lead 9, therefore, extends from approximately the lateral center of the bonding area 13 and the outer portion of the source lead 8 and the gate lead 9 does not include a bend towards the central drain lead 7.

Figure 4:
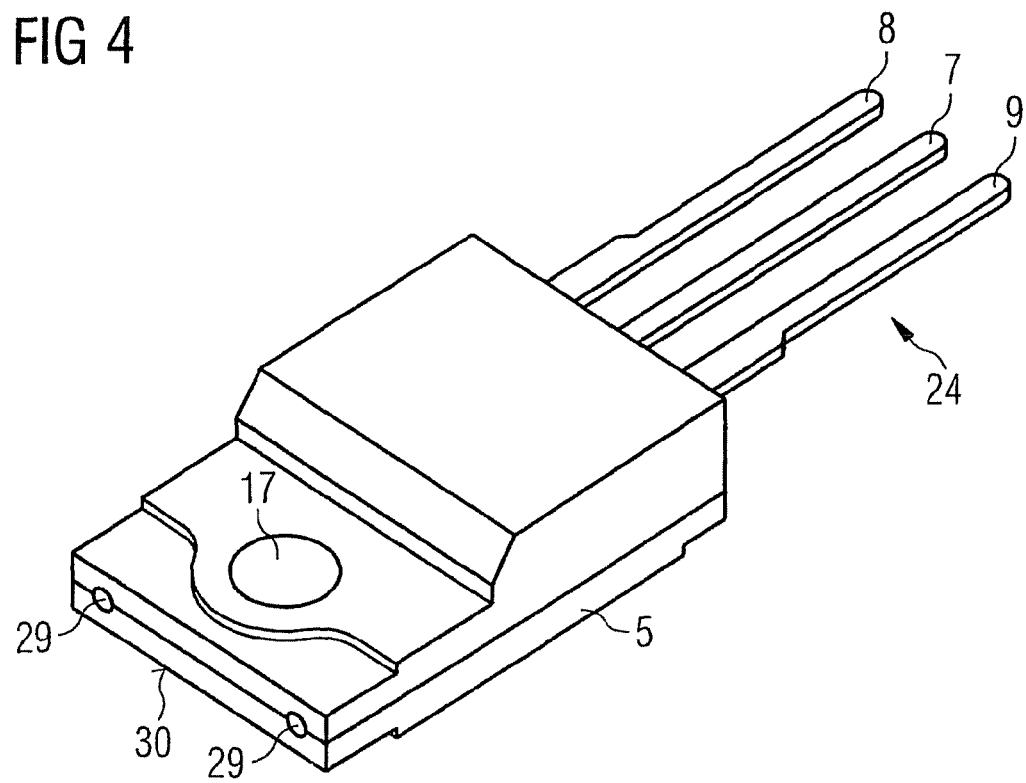
FIG. 4 illustrates a three-dimensional perspective view of a component manufactured on the leadframe strip of FIGS. 1 and 2.

FIG. 4 illustrates a three-dimensional perspective view of a package 24 manufactured using the lead frame strip 1 as illustrated in FIGS. 1 and 2. The package 24 has the package outline 5 of a TO220 package. The package housing 24 is thinner in the region surrounding the heat sink region 16 in which the aperture being is located. The package housing 24 is thicker in the region which covers the chip mounting region. The source lead 8, the drain lead 7 and the gate lead 9 extend from the mold material 25 of the package 24.

The package 24 fabricated using the lead frame strip 1, as illustrated in FIGS. 1 and 2, and using a method according to the invention includes two holes 29 in the side wall 30 of the package 24 adjacent to the heat sink region. The two holes 29 are formed by the removal of the first support bars 18 after the transfer molding process. The package 24 generally does not include pin marks, or marks resulting from the use of retractable pins in the transfer moulding process.

A method of transfer molding the two component positions 3 of a unit 1 of the leadframe strip illustrated in FIGS. 1 and 2 is illustrated with reference to FIGS. 5 to 8.

Figure 5:
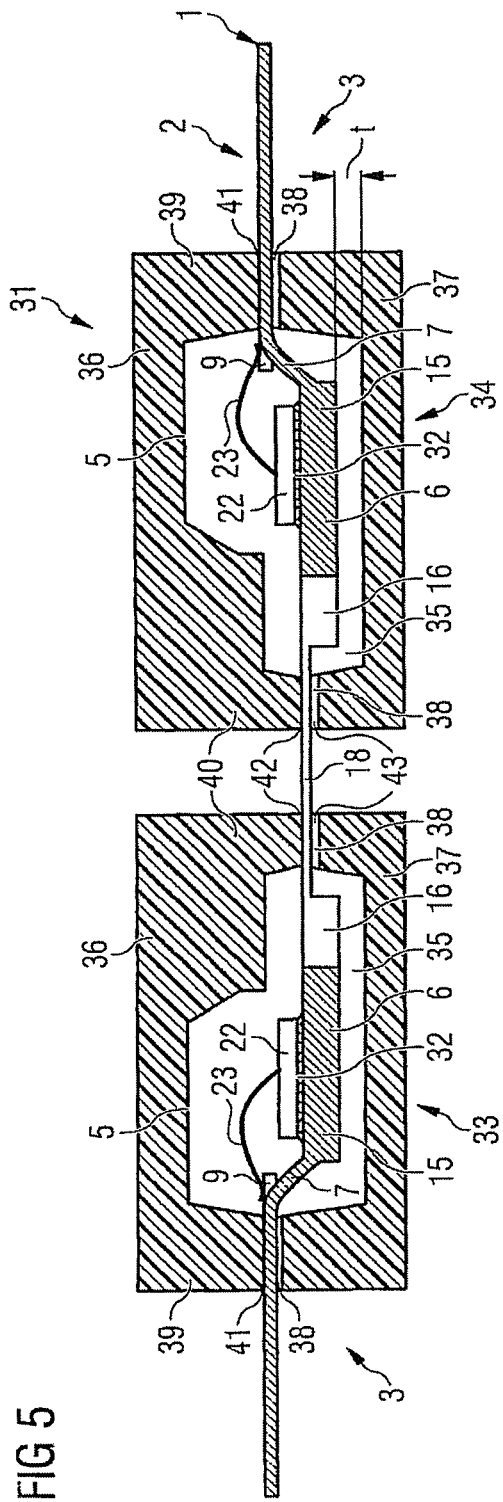

FIG. 5 illustrates a stage in a method to fabricate semiconductor packages 24 using the leadframe strip 1. A unit 2 of the leadframe strip 1 including two component positions 3 and a mold 31 are illustrated in cross-section.

Firstly, a semiconductor chip 22 is mounted by die attach material 32 to the chip mounting region 15 of each component position 3. The source electrode of the semiconductor chip 22 is electrically connected to the source lead 8 by a bond wire 23 and the gate electrode of the semiconductor chip 22 is electrically connected to the gate lead 9 by a bond wire 23. The drain electrode is located on the rear or opposing side of the semiconductor chip 22 and is, therefore, electrically connected to the chip support substrate 6 and drain lead 7 by the die attach material 32.

In the next stage of the process, the unit 2 of the leadframe strip 1 is clamped in the mold 31. The mold 31 is illustrated in FIG. 5 as including two portions 33 and 34. Each portion provides a cavity 35 for molding a component position 3 of a unit 2 in the leadframe strip 1. Each cavity has dimensions so as to produce a housing having the dimensions of a TO220 package. The two portions 33 and 34 are illustrated separately in the view of FIG. 5. In practice, the two portions 33, 34 may be mechanically joined together as this simplifies the alignment of the mold 31 on the lead frame strip 1.

Each portion 33, 34 of the mold 31 is essentially the same so that only one portion will be described in detail. Each portion 33, 34 has an upper part 36 and a lower part 37. The upper part 36 is positioned adjacent to the upper surface of the component position 3 and the lower part 37 is positioned adjacent to the lower surface of the component position 3. The two parts 36 and 37 of the mold 31 are brought together so that the outer tie bar 11 is clamped between the respective interfacial surfaces 38 of the outer side wall 39 of the upper part 36 and lower part 37 of the mold portion 33 so that the first support bar 18 is clamped between the respective interfacial surfaces 38 of the inner side wall 40 of the upper part 36 and lower part 37 of the mold portion 33.

The mold portion 33, therefore, includes three channels 41 which extend through the thickness of the outer side wall 39. Each of channel 41 is adapted to accommodate a source lead 8, a drain lead 7 or a gate lead 9. The opposing inner side wall 40 of the mold portion 33 includes two channels 42, each of which is adapted to accommodate a first support bar 18. The mold portion 33 further includes a through-hole 43 located in its inner side wall 40 which enables the mold compound to be injected into the cavity 35.

Each cavity 35 has the dimensions of a TO220 type package and is adapted so that, when the first support bar 18 and the outer tie bar 11 are clamped between the two parts 36 and 37 of mold portions 33 and 34, the chip support substrate 6 is held floating or in isolation within each of the cavities 35. The first support bar 18 extends between the chip support substrate 6 of two adjacent component positions 3 of a unit 2 and is clamped at each end in the inner side wall 40 between the two parts of the two portions 33, 34 of the mold 31. Therefore, the central portion of the first support bars 18 remain outside of the two cavities 35. The first support bars 18 can be accessed from outside of the mold 31. This can be achieved by providing through apertures in the mold 31.

The first support bar 18, which extends between the chip support substrate 6 of adjacent component positions 3 of a unit 2, therefore, ensures that each of the two chip support substrates 6 is held rigidly within its cavity 35. Therefore, bending or warping of the chip support substrate 6 during the filling of the cavity 35 by the mold material 25 is prevented. In this way, the thickness, indicated as t, of the isolation layer 27 positioned on the rear surface 26 of the chip mounting area 15 is maintained at a uniform value.

Figure 6:
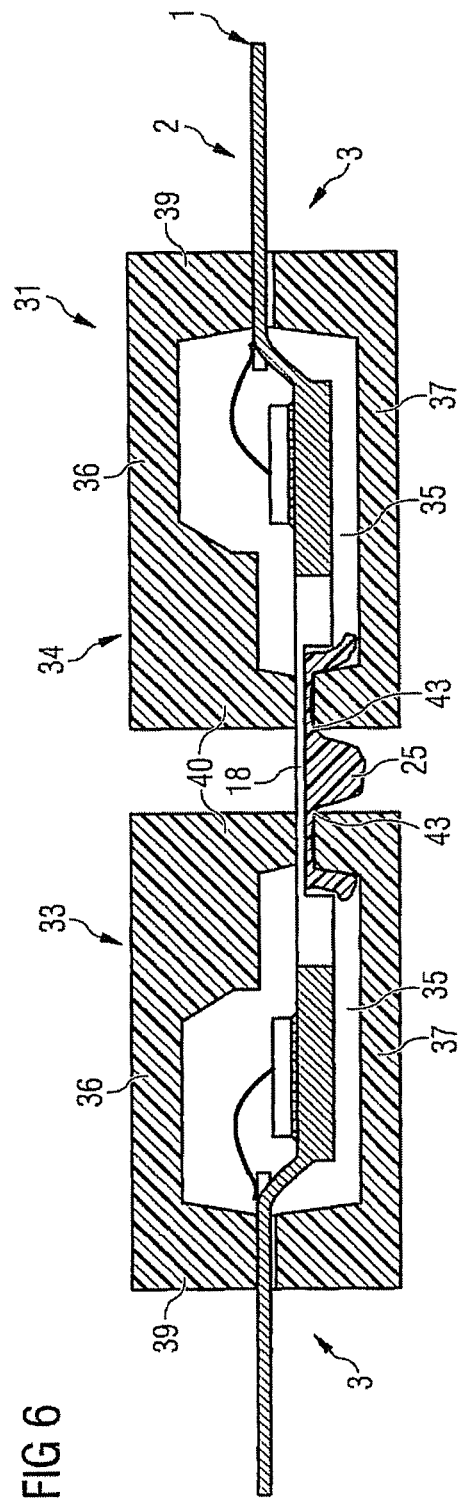

FIG. 6 illustrates the injection of the mold compound 25 through the injection holes 43 positioned in the inner side wall 40 of each portion of the mold 31. As can be seen from FIG. 6, the lead frame strip 1 of the invention has the advantage that two component positions 3 can be transfer molded that essentially the same time.

As the chip support substrate 6 of each component position 3 is mechanically attached by the first support bars 18 to the adjacent component position 3 in the unit 2, warping or pending of the chip support substrate 6 during the filling of the cavity 35 is prevented. Since the mold apparatus 31 and the leadframe strip 1 is essentially symmetrical about the long axis of the leadframe strip 1, the mechanical stresses are more uniformly distributed. Therefore, the mold 31 of the invention does not require the use of retractable pins to hold the chip support substrate 6 within the cavity 35. This provides the additional advantage that turbulence caused by the flow of the mold compound 25 around the pins is eliminated. This has the advantage that fewer voids are created within the molded package and flow marks on the surface of the package are avoided.

FIG. 7 illustrates the mold 31 when the two cavities 35 are completely filled with the mold compound 25. The mold compound 25 is then typically given an appropriate curing treatment to cross-link and solidify the material. This provides the housing of the package 24.

FIG. 8 illustrates the removal of the first support bars 18. This is achieved by applying a bending stress to the central portion of the first support bars 18 which are accessible from outside of the mold 31. This is easily achieved by using a stamping or pressing tool. The provision of the width narrowing at each of the joins between the first support bar 18 and the two chip support substrates 6 provides a predetermined breaking point 19 at the joint between the first support bar 18 and each chip support substrate 6. This ensures that, when the force is applied, the first support bar 18 will reliably break at this point. As can be seen in FIG. 8, this creates the characteristic holes 29 in the side wall 30 of the package 24 fabricated using the lead frame strip 1 and the method of the invention.

The remaining tie bars 11 and support bars 21 which hold the molded components 24 in the form of the leadframe strip 1 are then removed in a cutting and trimming process to create a plurality of packages 24. The packages may then undergo electrical testing and packages which fulfil the requirements can then be packaged for storage and transport. The package 24 can be mounted to a high-level substrate such as a printed circuit board by the use of a fixing means, such as a screw which is placed in the aperture 17 in the package 24. In this way the package 24 can be clamped to a flange or heat sink positioned in the printed circuit board. The package can be electrically accessed by the leads 7, 8 and 9 which are exposed from the plastic housing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for encapsulating electronic components comprising:
   providing a leadframe strip having an axis with two component positions arranged along the axis, each component position including a chip support substrate having a drain lead extending from the chip support substrate parallel to the axis and a source lead and a gate lead each extending parallel to the axis;
   providing a plurality of semiconductor chips, each semiconductor chip having a source electrode, a gate electrode and a drain electrode coupled together by a tie bar;
   mounting the plurality of semiconductor chips on respective ones of the chip support substrates;
   electrically connecting the gate electrode with an inner bonding area of the gate lead and the source electrode with an inner bonding area of the source lead by a plurality of bond wires;
   electrically connecting the drain electrode with the drain lead;
   encapsulating the semiconductor chips, the bond wires and the inner bonding areas of the source lead and of the gate lead in plastic material to form a component housing in each component position by a transfer mold process;
   wherein each component position is encapsulated at essentially the same time; and
   wherein a central portion of a first support bar extending parallel to the axis between the chip support substrates of the two component positions remains outside of the component housings.

2. The method for encapsulating electronic components of claim 1, further comprising:
   providing a mold having an upper part and a lower part;
   clamping the tie bars and the first support bars of each of the two component positions between the upper part and lower part of the mold such that two cavities are formed by the upper part and the lower part of the mold, and such that the chip support substrate of each of the two component positions of the unit floats in each of the cavities with a rear surface of the chip support substrate being spaced apart from a bottom surface defining the cavity by a distance.

3. The method for encapsulating electronic components of claim 2, wherein the plastic material is injected into each of the two cavities at essentially the same time.

4. The method for encapsulating electronic components of claim 1, wherein after the transfer molding process, the first support bar is cut by applying a bending stress.

5. The method for encapsulating electronic components of claim 2, wherein the chip support substrate includes a rear surface that is spaced apart from a bottom surface of the lower part of the mold defining the cavity by a distance in the range from approximately 0.3 mm to approximately 0.5 mm.

6. The method for encapsulating electronic components of claim 2, wherein the upper part and the lower part of the mold hold the chip support substrates of the two component positions of the unit in tension.

7. The method for encapsulating electronic components of claim 2, wherein each cavity has the dimensions of the component housing of a TO220 package.

8. The method for encapsulating electronic components of claim 3, wherein the mold has first and second portions corresponding to the first and second component positions, the first and second portions each have an outer side wall with three channels, the first and second portions each have an inner side wall with a channel and a through hole, the inner side walls of the first and second portions face one another; and wherein the method further includes:
  situating the leadframe strip between the upper and lower parts such that the drain, source and gate leads extend through the channels in the outer side walls, and the support bar extends through the channels in the inner side walls; and
  injecting the plastic material into the cavities simultaneously through the through holes in the inner side walls.

* * * * *